United States Patent [19]

Palmer

[11] Patent Number: 4,768,291
[45] Date of Patent: Sep. 6, 1988

[54] APPARATUS FOR DRY PROCESSING A SEMICONDUCTOR WAFER

[75] Inventor: David W. Palmer, North Andover, Mass.

[73] Assignee: Monarch Technologies Corporation, Billerica, Mass.

[21] Appl. No.: 24,828

[22] Filed: Mar. 12, 1987

[51] Int. Cl.$^4$ ............................................. F26B 3/04
[52] U.S. Cl. ........................................ 34/22; 34/36; 34/198; 34/218
[58] Field of Search .................... 34/198, 77, 218, 22, 34/36; 123/472

[56] References Cited

U.S. PATENT DOCUMENTS 3,236,073  2/1966  Davison et al. .................. 34/77
3,943,904  3/1976  Byrne ............................. 123/472
4,592,926  6/1986  Rubin et al. ..................... 414/217

*Primary Examiner*—Larry I. Schwartz
*Attorney, Agent, or Firm*—Robert T. Dunn

[57] ABSTRACT

A method and apparatus of dry processing a semiconductor wafer including processes of vacuum baking and dry silylation provides a gaseous atmosphere of pressure up to 760 Torr against the surface of the wafer, one or more of the constituents of the gas being obtained from a liquid fluid source of the constituent, including a metering device that controls flow of the liquid fluid from a remote reservoir and feeds it to a vaporizer that converts the fluid to a vapor gas at pressure up to 760 Torr and feeds the vapor gas at that pressure into a wafer processing chamber where the particular dry process involving the vapor gas is carried out on the wafer surface. In a preferred embodiment the metering device is an automotive fuel injector, sometimes referred to as a throttle body injector (TBI) that is energized by electrical pulses, each electrical pulse causing the TBI to inject a given predetermined amount into the vaporizer which heats the fluid, turning it into a vapor gas at pressure up to 760 Torr.

24 Claims, 3 Drawing Sheets

VAPOR PRESSURE VS.
TEMPERATURE - HMDS

APPARATUS FOR DRY PROCESSING A SEMICONDUCTOR WAFER

BACKGROUND OF THE INVENTION

This invention relates the method and means of dry processing a semiconductor wafer and particularly for those dry processes that provide a gaseous atmosphere against the processed surface of the wafer in which a gas constituent is obtained from a liquid fluid source.

Fabrication of integrated circuits on a semiconductor wafer substrate involves a number of processes including photolithography processes that impose a pattern in photoresist material on the substrate that varies in its resistance to chemical development or dry etching depending upon exposure to a beam of radiation. The beam of radiation may be a light beam, an electron beam (E-beam), X-rays or an ion beam. The development process leaves patterns of the resist material at the surface of the wafer upon which other processes such as deposition, impurity implantation and other chemical processes are carried out.

The photolithographic process usually begins with preparation of the wafer for coating. That preparation may include cleaning, dehydration and priming. Heretofore, many of these pre-coating steps have involved applying a liquid fluid to the wafer surface.

Cleaning requires flooding the wafer with water and scrubbing with a roller brush scrubber or high pressure spraying with water, followed by rinsing the water to insure complete removal of fluids containing contaminates. Residues are removed by high temperature baking in combination with exposure to liquid hexamethyl-disilazane (HMDS) and sometimes in combination with vacuum and vapors of HMDS. This is called priming. These and other conventional steps have been used to reduce defect density by removing sub-micron particles and preparing and promoting photoresist adhesion.

Adhesion of the photoresist to the semiconductor wafer surface is compromised by contaminates or water on the surface. Wafers that have been exposed to humidity or that have had direct contact with water during cleaning processes may have a mono layer of water attached to the surface by Vanderwal forces. Failure to remove the water may result in compromising the bond between the photoresist and the semiconductor surface resulting in high defect density. Photoresist has conventionally been accomplished by chemically changing the surface of the wafer by:

1. Removing the mono-layer of water with heat (360° C.).
2. Silylating the semiconductor surface by exposure to organometallic reagents like HMDS.

Methods of exposing the surface of an uncoated semiconductor wafer to a primary silylating reagent like HMDS include the following:

(a) Flooding the wafer surface with liquid reagent. For example, HMDS is puddled on the surface to prime it.
(b) Expose the wafer surface to vapors of the reagent and nitrogen at atmospheric pressure (760 Torr) and elevated wafer temperature. An example of this technique is described in U.S. Pat. No. 4,556,785, entitled "Semiconductor Wafer Baking Apparatus", issued 12/03/85 to J. Blechschmi, R. D. Coyne, D. Palmer and J. A. Ptatt.
(c) Expose the wafer surface to vapors of the reagent in a sealed container (vapor pressure 1 to 16 Torr) and heat the wafer. For example, the system is loaded in an oven and the liquid reagent is heated to raise its vapor pressure.

At this time, the above methods are performed by equipment available from several sources.

The coating process in present use is a wet process and is suitable for use in conjunction with the method and apparatus of the present invention. Coating materials are positive or negative resist. Some of these are developed wet and some are developed by heat or by auto-evaporation of exposed resist. Wet development of both positive and negative resist is the most widely used. Self-development resists have had limited use due to their inability to stand up to dry process demands of advanced manufacturing methods such as reactive ion etching (RIE).

Developing of positive or negative resist is conventionally a wet process and involves the use of spinners for the spray application of liquid reagents formulated to remove the resist selectively and so transfer the radiation image through the resist to the semiconductor wafer surface to be processed (etched). Perfection of these wet develop techniques have for the most part addressed the problem of developing uniformity and do little or nothing to reduce particles produced during the wet developing, wet etching processes.

Etching must be clean reliable and accurate to be suitable for VSLI line widths. That need has motivated development of techniques of processing semiconductor wafers in a vacuum using reactive ion etching (RIE). The method and apparatus of the present invention teaches developing and etching of both positive and negative photoresists in an RIE process after exposure.

Self developing photoresists and the techniques for using them will become more useful when apparatus according to the present invention is available to maintain wafer to wafer consistency. The present invention teaches a method and apparatus for stabilizing the photoresist and making the resist more resistant to damage, particularly when the image is transferred to the semiconductor surface during RIE.

Wet Process Photolithography

As mentioned above, many of the processing steps involve applying a liquid fluid to the wafer surface. For example, the wet process for carrying out photolithography requires flooding, spraying or immersing the wafer in a liquid fluid chemical under controlled conditions calculated to accomplish the process. That process is terminated by removing the liquid from the wafer and is followed by rinsing the wafer with another liquid to ensure complete removal of the first liquid. There must not be any residue of the process liquids left on the wafer and particular handling techniques must be followed to ensure this. An advantage of dry processing where a gas fluid is used rather than a liquid fluid avoids these problems of residue and replaces many steps with one.

Dry Process Photolithography

A dry photolithography process usually begins with treating the surface of a silicon wafer. Then the wafer surface is coated with a photoresist by a wet process, because that is the best known way of adding the photoresist. Next the photoresist is exposed to radiation through a mask pattern and then steps are taken to develop the pattern including removing the unexposed parts of the etchable substrate in which the photoinitiator is not exposed. As mentioned above, perfection of this dry photolithography process has led to a technique of priming the wafer before the photoresist is applied to it. The effect of the priming step is to ensure adherence of the photoresist to the silicon so that it will not separate during the following processing. From such separation, small pieces of exposed (imaged) resist are lost during the development, degrading the process.

Priming Processes

One priming process, in effect, is a silylation process that uses silane vapor. The silane vapor can be obtained from vaporizing an organosilicone compound such as liquid silane sold under the trade name HMDS. One source of such HMDS is marketed under the trademark HMDS PLUS and is a hexamethyldisilazane. Another suitable from of HMDS is glycidoxypropyltrimethoxysilane which has been produced by IBM.

Photoresist Silylation To Resist Etching

Another silylation process, in effect, coats the radiation exposed (imaged) photoresist with organometallic polymers which are particularly resistant to plasma etching. As a consequence, the subsequent dry etching process can then be accomplished by reactive ion etching (RIE), applying a plasma such as oxygen or halocarbon plasma or another RIE gas has little effect on the organometallic silylated resist which forms only where the photoresist has been exposed to radiation, whereas RIE removes the organometallic monomers that remain unbonded in the resist where it has not been exposed to radiation; and, of course, removes the unsilylated resist layer below it.

Such a process for HMDS silylation of the surface of the photoresist substrate for preparing a negative relief image is described in U.S. Pat. No. 4,551,418 which issued Nov. 5, 1985 to Hult et al and is entitled Process for Preparing Negative Relief Images With Cationic Photo Polymerization. That patent describes the process of HMDS silylation as including steps of coating a silicon substrate with an etchable substrate such as a polymeric layer containing at least at its surface a cationic photoinitiator. The photoinitiator is exposed to radiation through a mask (a pattern or radiation) and then contacted with the HMDS at vapor pressure between 6 and 500 Torr. The HMDS is susceptible to cationic polymerization and so forms a polymer on the polymeric layer where the cationic photoinitiator has been exposed to radiation. This polymerized monomer formed from the HMDS ranges in thickness from a few angstrom units to several microns and the polymerized products contained in it include organometallic polymers which are particularly resistant to plasma etching. In this way, a thin layer is formed on the photoresist substrate that is highly resistant to plasma etching where the photoresist surface has been exposed to radiation.

It is an object of the present invention to provide a method and means of performing all of the above mentioned silylation steps to increase the resistance of the radiation exposed photoresist to plasma etching and in addition perform the steps of priming and several steps of baking in a predetermined sequence on a given wafer without removing the wafer from the apparatus and in which all of the processes are dry processes.

Handling Reagents

HMDS and similar organosilicone compounds are highly volatile, flammable liquids. Heretofore, processes like priming have been carried out with HMDS at approximately 6 Torr and the results have been reasonably satisfactory. Priming has not been carried out at pressure greater than 6 Torr even though there is evidence that the priming process would be carried out faster and perhaps more effectively at a higher pressure (higher concentration of HMDS gas). Similarly, silylation with organosilicone compounds such as HMDS in the vapor phase have been carried out at 6 Torr although that process is preferable carried out at at least 200 Torr HMDS vapor pressure which requires heating the HMDS liquid to over 70° C. in order to produce the 200 Torr vapor pressure. At that temperature the HMDS will flash into combustion in the presence of oxygen and so is a hazard.

It is another and further object of the present invention to provide a method and means of producing HMDS gas and vapor at pressures on the order of 200 Torr while avoiding the hazardous conditions mentioned above and encountered in experimental work done in the past.

SUMMARY OF THE INVENTION

It is a further object of the present invention to provide a method and means of converting a liquid reagent into a gas or vapor in a processing chamber at a pressure substantially greater than the vapor pressure of the liquid at room temperature and atmospheric pressure (21° C. and 760 mm Hg) also called standard temperature and pressure or STP.

It is another object to provide apparatus for converting a liquid reagent into a vapor gas at controlled temperature and pressure above STP in minute discreet quantities of the liquid, in sequence, as controlled by electrical impulses, whereby a count of the electrical impulses represents a given predetermined quantity of the material.

It is another object to provide a method and means of producing and maintaining the vapor pressure of the reagent in the processing chamber at a predetermined (desired or set) pressure by controlling said electrical impulses so that the chamber pressure reaches the desired pressure without overshoot or oscillation around the desired level.

Embodiments of the present invention incorporate a method and apparatus of dry processing a semiconductor wafer including processes of vacuum baking and dry silylation in which a gaseous reagent atmosphere (such as HMDS) of pressure up to 760 Torr is provided against the surface of the wafer, the reagent being obtained from a liquid fluid source and the gaseous reagent atmosphere being isolated from the liquid fluid reagent source. The apparatus includes a metering device that controls flow of the liquid fluid reagent from a remote reservoir and feeds it to a vaporizer that converts it to a vapor gas at pressure up to 760 Torr. That gas is fed to the wafer processing chamber where the particular dry process involving the Reagent gas is carried out on the wafer surface.

In a preferred embodiment the metering device is an automotive fuel injector, sometimes referred to as a throttle body injector (TBI) that is energized by electrical pulses, each electrical pulse causing the TBI to inject a given predetermined amount of the reagent into the vaporizer which heats the fluid, turning it into a vapor gas at pressure up to 760 Torr.

In a preferred embodiment, the electrical pulse rate is varied as a function of processing chamber pressure. Also, processing chamber pressure is maintained at a given predetermined value (desired or set pressure); and for that purpose, a feedback signal is produced that represents the results of a comparison of chamber pressure with desired chamber pressure and the feedback signal controls the pulse rate. More particularly this is a null type feedback control system and is damped so that chamber pressure does not oscillate around the desired pressure. The pulse rate reduces gradually as chamber pressure approaches the desired or set pressure and when this feedback system operates ideally, the damping is critical.

Applications of the present invention described herein include, the processing step that uses HMDS to prime the surface of the silicon substrate before coating the surface with a layer of photoresist material, referred to herein as "Prime". After Prime, the surface is coated with a thin layer (about 0.5 to 2.0 microns thick) of photoresist such as a polymeric layer containing a cationic photoinitiater such as sold under the trademark "140" by Shipley Company. This is referred to herein as "Coat". The substrate is baked at about 50° C. for about a minute until the photoresist layer hardens and volatile solvents are driven off. The preferred technique in the present invention is to include the photoinitiator in the resist layer. During the baking process, the photoinitiator is incorporated into the body of the photoresist polymer layer. This baking process is referred to herein as "Softbake".

The next step is exposure to radiation through a mask to create an exposed pattern on the photoresist layer, the exposure preferably being done using ultraviolet (UV) radiation at one of the principal spectral lines of a mercury arc (577, 546, 435, or 365 nm wavelength). This step in processing is referred to herein as "Exposure". Next, follows the silylation process that induces the formation of organometallic polymers at the surface of the photoresist where the photoresist has been exposed to the UV radiation. This processing step is referred to herein as "Silylation". Following that, or simultaneous with the Silylation, a hard baking process ensues at controlled temperature for a predetermined duration. This step is referred to herein as "Hardbake". Finally, the etching process is performed and in the preferred embodiment herein it is an oxygen plasma etching process that is a reactive ion etching (RIE) process and is preferred to other RIE processes. This etching process is referred to herein generally as "RIE".

According to the present invention discreet predetermined quantities of a liquid, herein referred to as reagent, at controlled initial temperature and pressure are converted into a vapor gas at a substantially greater pressure and temperature than the vapor pressure of the liquid at standard temperature and pressure (STP). In particular embodiments of the present invention this feature is advantageously used to convert a flammable organosilicone reagent liquid, like HMDS, at STP into a vapor gas at far greater pressure than the vapor pressure of the reagent liquid at STP, because it avoids heating the source of reagent liquid to provide the higher pressure of vapor at the liquid vapor interface thereof and, instead, permits raising temperature and pressure of only small successive quantities of the flammable liquid reagent.

In a particular embodiment of the present invention described herein, the reagent is HMDS and the converter includes a metering device having a liquid fluid input from an HMDS liquid reservoir and a vapor output that flows into an evaporator and filter that convert substantially all of the HMDS vapor into a gas and heats the gas. The metering device is an automotive throttle body injector (TBI) that is actuated by electrical pulses causing the TBI to inject a given predetermined quantity of the liquid fed to it each time it is actuated. The evaporator and filter open into the wafer processing chamber on which a suitable back pressure is maintained, (about 200 Torr) for carrying out the HMDS silylation process. The metering device (TBI) isolates the high temperature HMDS gas from the HMDS liquid source at STP and draws only as much of it from the source as is needed to charge the wafer processing chamber. Clearly the source can be located remote from the metering device and the processing chamber and the source can be maintained at all times at a safe low temperature.

The same apparatus and method can be used to carry out the Prime process more effectively than in the past, because it can be carried out at higher pressure and temperature of the reagent vapor.

Other objects and features of the present invention will be apparent from the following detailed description of the several features of the invention mentioned above taking in conjunction with the drawings in which:

EMBODIMENT OF THE INVENTION

Figure 1:
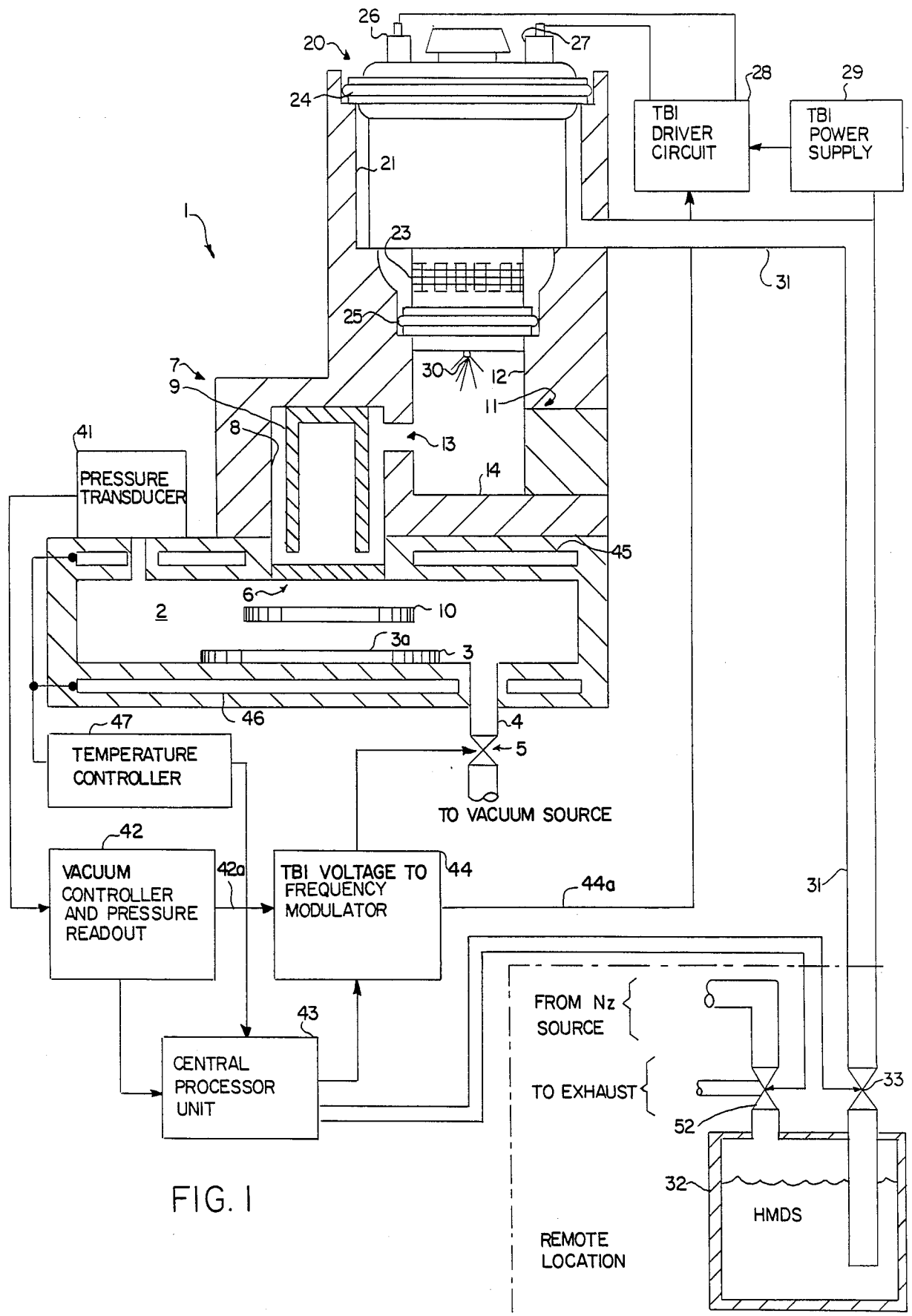
FIG. 1 is a partially schematic electric and fluid flow diagram and partially structural diagram shown in cross section of a reagent flow system and controls using an automotive throttle body injector (TBI) for metering HMDS flow to a dry processing vacuum module chamber, so that the source of the reagent may be safely isolated from the system.

FIG. 1 is a diagram showing the significant parts of a vacuum processing module for dry vacuum surface treatment of a semiconductor wafer for performing some of the processes involved in forming integrated circuit structures on the wafer surface. The processes that the module along with its controls and fluid feed can perform are the processes: Prime, Softbake, Hardbake and Silylation, in whatever order desired, rapidly and under ultra-clean conditions.

While the module shown in FIG. 1 does not have the capacity of use of coating the primed surface of the wafer with a suitable photoresist film and it has no provisions for irradiating the photoresist with radiation through a mask to define a pattern (an electric circuit pattern) in the resist and it does not have use to etch the photoresist to form the pattern, it is suggested that those capacities can be added to this module by modifications so that all the processes from priming through etching could be accomplished on the wafer without removing it from such a modified module. This module structure is shown as an example of what can be done toward providing equipment that can operate to perform the full series of processes from priming through etching on a semiconductor wafer and particularly to perform all of the processes dry.

In FIG. 1, the module 1 is shown in cutaway view to reveal the principal parts includes a wafer processing vacuum chamber 2 containing semiconductor wafer 3 held flat (by means not shown) exposing the top surface 3a to be processed. The processing chamber part of module 1 and other parts, for the most part, are figures of revolution and so are shown fully by the cutaway view in FIG. 1. The chamber is evacuated by a vacuum source (not shown) and for this purpose tube 4 leads from the periphery of the chamber to vacuum control valve 5 that connects to the vacuum source. Gas input to the chamber is through central port 6 that leads from a filter evaporator 7 formed in cavity 8, that includes a porous cup-shaped filter 9 which may be a pebble bed filter of 0.01 micron porosity. These filter substantially fills cavity 8 with some clearance around the outside of the filter. A pebble bed filter suitable for this embodiment has 0.01 micron pores is made of 0.5 micron beads and is approximately a half inch in diameter. Such a filter is available from Mott Company and is effective to aid evaporation of vapor flowing through it to the processing chamber.

The purpose of filter evaporator 7 is to convert any vapor injected into gas. In this process, the filter 9 holds any vapor flowing into it from trap 11 and spreads the vapor throughout the porous structure of the filter so that it evaporates. Evaporation is accelerated by heating the filter, its cavity and the trap cavity. Trap 11 is formed by cavity 12 and the filter cavity 8 and the trap cavity 12 are preferably arranged upright as shown and the opening at 13 between the two cavities is above the floor 14 of the trap cavity and so a liquid trap is formed.

Heating to accelerate evaporation may be done with heaters surrounding or within the filter cavity and trap cavity, and/or by heat flow through the body of the module 1 from heaters 43 and 44 in the walls of processing chamber 3.

Above the trap cavity 12 positioned to inject vapor and gas into it is metering device 20. This device receives a liquid reagent to be gasified, such as liquid HMDS, from liquid flow line 31 from a container 32 of the liquid reagent at a remote location where the reagent liquid is contained at a safe temperature and pressure, such as standard temperature and pressure (STP) and is surrounded by such physical barriers as required by safety standards for storing volatile flammable liquids.

A valve 33 in line 31 controls the liquid reagent in the line to metering device 20. The liquid reagent from line 31 flows into the metering device cavity 21 in module 1 around device 20 and through a filter 23 in the metering device into the device body.

Metering device 20 may be constructed substantially the same as an automotive throttle body injector (TBI) such as used in many General Motors automobiles. As such, it is controlled by electrical pulses from an electric power supply and each electrical pulse causes the injector to inject a given predetermined quantity of the liquid fluid fed to it. Inasmuch as a reagent such as HMDS, has properties that are similar to gasoline with respect to density, viscosity, flammability and even non-compatibility to synthetics, the TBI pump can be used for injecting any of a number of silylating reagents into module 1 substantially as it is used in a General Motors automobile. Even the operating range of the TBI is suitable for use as described herein. For example a single impulse injection from a TBI is completed in 4 milliseconds and injects (meters) a volume of about 0.01 milliliters and this can be repeated up to 250 times per second to vary the flow rate.

The TBI (metering device) is seated in its cavity 21 and sealed at the top and bottom. For this purpose a top O ring seal 24 and a bottom O ring seal 25 are provided. Thus, the annular cavity around the outside of the TBI and cavity 21 between the top and bottom O ring seals defines a closed, sealed space for containing a small portion of the liquid reagent so that it flows on demand through filter 23 and into the TBI.

TBI 20 is actuated by electrical pulses provided to it at terminals 26 and 27 from TBI driver circuits 28 energized by TBI power supply 29. With each electrical impulse to these terminals, a plunger within the injector cycles and an impulse of reagent HMDS is injected from the bottom of the TBI at point 30 into the trap cavity 12. Thus, liquid reagent is fed into TBI 20 at STP and the TBI meters reagent in discreet impulses as a mixture of gas and vapor into vacuum (the pressure in cavity 12) that is maintained by the vacuum source depending upon the operation of vacuum source valve 5. The pressure in cavity 12 is substantially below atmospheric and only slightly greater than the pressure maintained in processing chamber 2.

The impulse of reagent gas and vapor injected at 30 flows through trap wherein some of the vapor is gasified and this predominantly gaseous mixture of gas and vapor flows through 13 into filter evaporator 6 where it encounters the heated pebble bed filter 9 and any remaining vapor is gasified. As a result the fluid going into chamber 2 fills the chamber with a pure gaseous reagent environment against the top surface 3a of wafer 3. The reagent is prevented from impinging directly on wafer 3 by shield 10 which causes the vapor gas entering 6 to spread throughout processing chamber 2.

The pressure in chamber 2 is maintained by operations of valve 5. For this purpose, pressure in chamber 2 is detected by transducer 41 which converts that pressure signal into an electrical signal that is fed to vacuum controller and pressure readout unit 42. Unit 42 contains circuits that compare the pressure signal from transducer 41 with a signal representative of desired or set pressure that may be stored in central processor init (CPU) 43 or may be manually input. The output of unit 42 is the feedback signal (FB) in line 42a representative of the pressure differential that the system must make up by feeding HMDS vapor to the chamber.

The FB signal is fed to TBI voltage/frequency modulator unit 44 which generates suitable control pulses to TBI driver circuits 28 that controls actuation of TBI 20. Modulator unit 44 generates pulses of duty cycle and rate dictated by an output of CPU 43 and the FB signal. Those pulses are fed via line 44a to TBI driver circuits 28. When the differential pressure is large, the pulse rate is high and when the differential is small, the pulse rate is low and may approach zero as the differential approaches zero. If chamber pressure exceeds the desired or set pressure, a signal is fed via modulator unit 44 to vacuum source valve 5 causing the valve to open, relieving the chamber pressure into the vacuum source. By this null type feedback control system, the desired or set chamber pressure is produced and maintained.

Figure 2:
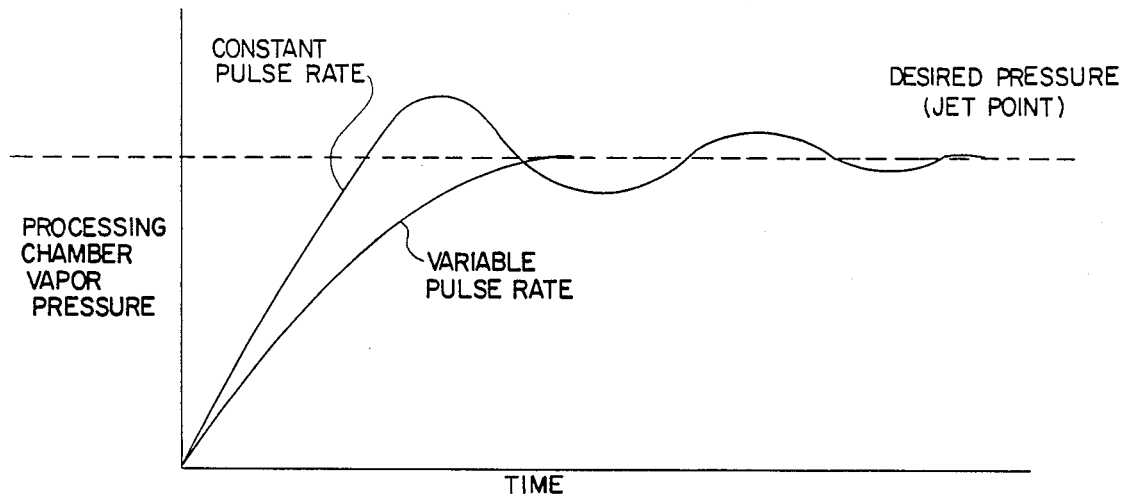
FIG. 2 is a plot of processing chamber vapor pressure versus time for the system shown in FIG. 1 wherein the pulse rate of control sugnals to the TBI driver circuit is variable and shows the advantage of variable pulse rate according to the present inventuion over fixed pulse rate.
Figure 3A:
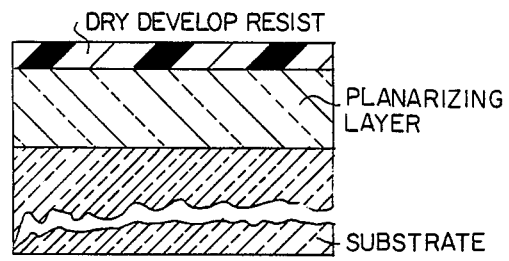
FIGS. 3a, 3b, and 3c are diagrams representing part of a wafer in cross section illustrating the process of HMDS silylation and following that the effects of the hard baking and RIE development processes. These drawings are diagrams and the are offered as an aid to understanding the processes.
Figure 3B:
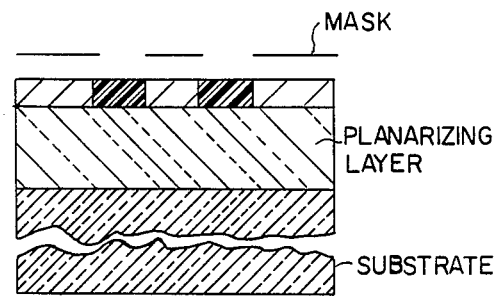
Figure 3C:
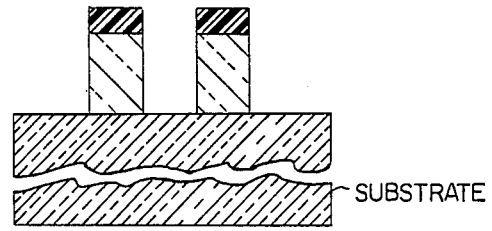
Figure 4:
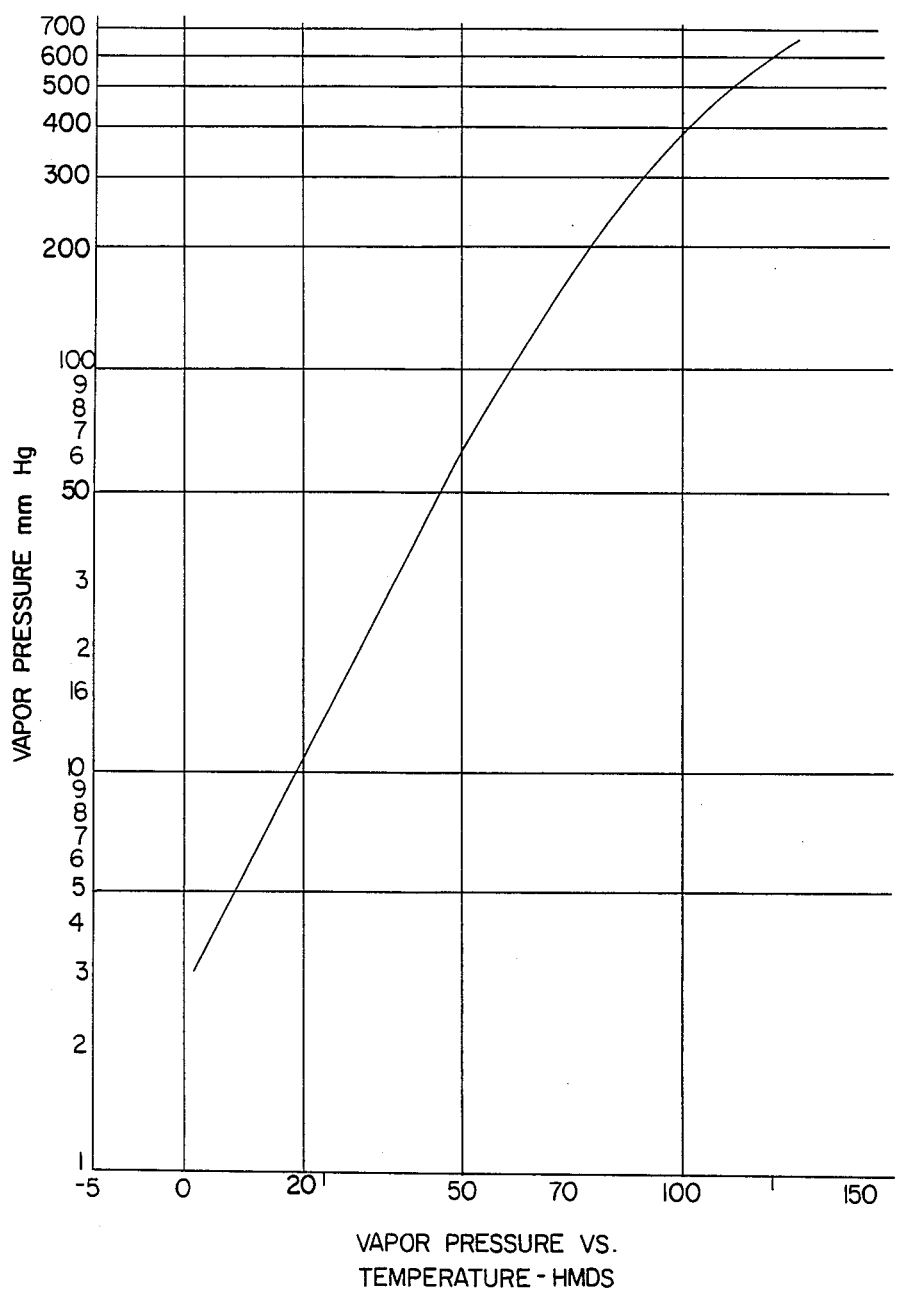
FIG. 4 is a plot of HMDS vapor pressure versus HMDS liquid temperature.

FIG. 2 is a plot of processing chamber pressure versus time showing the operation of the system of FIG. 1 where pulse rate is varied or modulated bringing the chamber pressure to the desired or set level without overshoot or oscillation around the desired pressure. The plot also shows chamber pressure versus time for a aimilar system wherein pulse rate is constant. A system operating with constant pulse rate may reach the desired pressure level quicker, but is likely to overshoot and oscillate around the desired pressure.

The temperature of the reagent gas in reaction chamber 2 is controlled by heating pads 45 and 46 that may be embedded in the chamber walls and so the pressure and temperature of the reagent gas and the processing chamber is fully controlled and can be maintained at pressure up to 760 Torr or greater even while the vapor pressure on the reagent tank 32 is no more than 6 Torr (or the vapor pressure of the Reagent at STP). For that purpose, temperature controller 47, controlled by CPU 43 is provided.

Clearly, TBI (metering device 20 isolates processing chamber 2 from the tank 32 of liquid reagent. It should also be clear that the line 31 carrying liquid Reagent from the tank to the injector can be a very small diameter line so that the total quantity of reagent contained in that line and throughout the module 1 is a very small quantity and so creates minimal hazard.

The volume of liquid over a range of pressures ranging from 5 psi to 20 psi that are injected by a TBI in a given number of impulses does not change very much as duty cycle of the impulses even between 25% and 50%. Hence, changing the duty cycle does not significantly change the flow rate, all else being the same; however, the number of impulse injections per second varies the flow rate linearly.

In operation, the pressure in the wafer processing chamber 2 is controlled by the combined action of vacuum valve 5, the feedback control system including units 42, 43, 44, TBI driver circuit 28 and TBI 20, and the temperature is controlled by electric power to the heater pads 43 and 44 from temperature controller 47. Thus, temperature and pressure in the processing chamber are maintained as dictated by a program in CPU 43. This electrical feedback system feeds electrical energizing impulses to TBI 20 and controls reagent line valve 33 that controls the flow of liquid HMDS to the TBI. CPU 43 may also control the flow of nitrogen gas from a source through valve 52 into the top of the HMDS reagent tank 32 to pressurize the tank. The nitrogen is used to vent the top the tank.

CONCLUSIONS

The semiconductor wafer vacuum processing module, its liquid reagent feed system and pressure, temperature and gas flow controls described herein is capable of handling volatile liquid fluids at safe conditions and converting the liquid fluid to gas at just about any temperature and pressure desired, while at the same time isolating the gas containing parts of the feed system from the liquid fluid containing parts. This module along with its feed system and controls is capable of performing the processing steps forming circuit structures on a semiconductor wafer of: Prime, Softbake, Hardbake, and Silylation, without interruption and without opening the module to remove, replace or otherwise treat the wafer; and all of these steps are dry processing steps, inasmuch as the wafer is exposed only to vacuum or gas and is not exposed to liquid fluids.

It is suggested that the module described herein its feed system and controls could be adapted to perform by dry processing all other steps from Prime through Silylation followed by reactive ion etching (RIE) using a dry etching plasma such as oxygen or a halocarbon plasma.

The injector 20 described herein as an automotive type throttle body injector (TBI) could have substituted therefore other equivalent devices and either the TBI assembly or the equivalent devices could be used to inject other processing chemical reagents than HMDS that pose the same or similar problems that are overcome by use of a TBI type metering device as disclosed herein. These and other variations and addition to the structure described herein could be made without deviating from the spirit and scope of the invention as set forth in the claims.

What is claimed is:

1. Apparatus for dry processing a semiconductor wafer in the manufacture of circuit patterns thereon comprising,
    (a) a vacuum chamber for containing said semiconductor wafer to be processed,
    (b) an opening into said chamber for the flow of a processing fluid in gaseous form into said chamber,
    (c) a source of said processing fluid in liquid form,
    (d) between said source of processing fluid in liquid form and said chamber opening, a fluid meter having a liquid fluid input and an output into a relatively low pressure evaporation chamber that connects to said opening into said processing chamber for converting said metered fluid into metered gas fluid, said metered gas fluid being isolated from said liquid fluid by said fluid meter and
    (f) means for energizing said fluid meter,
    (g) whereby said fluid meter passes liquid fluid from said source in metered quantities into said evaporation chamber as a mixture of gas and vapor and said mixture is substantially all converted into gas that flows through said opening into said processing chamber.

2. Apparatus as in claim 1 wherein
    (a) a liquid fluid trap is provided between said fluid meter output and said processing chamber.

3. Apparatus as in claim 1 wherein
    (a) means are provided for controlling and monitoring the pressure and temperature in said processing chamber and for controlling the flow of said processing fluid in liquid form to said fluid meter to maintain a predetermined pressure and temperature in said processing chamber.

4. Apparatus as in claim 3 wherein
    (a) said fluid meter is energized in impulses and
    (b) said flow of said processing fluid in liquid form is increased by increasing the impulse rate of said fluid meter energization.

5. Apparatus as in claim 4 wherein
    (a) the flow of said processing fluid in gaseous form into said processing chamber is directly proportional to said fluid meter energization impulse rate.

6. Apparatus as in claim 5 wherein said fluid meter is constructed and operated similar to an automotive throttle body injector (TBI) of the sort that feeds gasoline to an automobile engine.

7. Apparatus as in claim 3 wherein said fluid meter is constructed and operated similar to an automotive throttle body injector (TBI) of the sort that feeds gasoline to an automobile engine.

8. Apparatus as in claim 3 wherein said fluid meter is constructed and operated similar to an automotive throttle body injector (TBI) of the sort that feeds gasoline to an automobile engine.

9. In apparatus for dry processing a semiconductor wafer that includes a vacuum processing chamber that contains the semiconductor wafer to be processed, an opening into said chamber for the flow of processing gas into said chamber and a source of processing fluid in liquid form, the improvement comprising,
(a) means defining a fluid flow path between said source of processing fluid in liquid form and said opening for converting said liquid fluid into gas fluid whereby said gas fluid is isolated from said liquid fluid,
(b) a liquid fluid conduit is provided for said liquid fluid from said source to said converting means at essentially the same temperature and pressure as said liquid fluid at said source,
(c) said converting means includes metering means having a liquid fluid input and an output into a relatively low pressure evaporation chamber that connects to said opening into said processing chamber and
(d) means for driving said metering means,
(e) whereby said metering passes liquid fluid from said source in metered quantities into said evaporation chamber as a mixture of gas and vapor in said mixture is substantially all converted into gas that flows through said opening into said processing chamber.

10. Apparatus as in claim 9 wherein
(a) a liquid trap is provided between said metering means output and said processing chamber.

11. Apparatus as in claim 9 wherein
(a) means are provided for controlling and monitoring the pressure and temperature in said processing chamber and for controlling the flow of said processing fluid in liquid form to said metering means to maintain predetermined pressure and temperature in said processing chamber.

12. Apparatus as in claim 11 wherein
(a) said flow of said processing fluid in liquid form is increased by increasing the energization rate of said metering means.

13. Apparatus as in claim 12 wherein
(a) said flow of said processing fluid in gaseous form into said processing chamber is directly proportional to said energization rate of said metering means.

14. Apparatus as in claim 13 wherein said metering means is constructed and operated similar to an automotive throttle body injector (TBI) of the sort that feeds gasoline to an automobile engine.

15. A method of performing a dry process on a semiconductor wafer in a closed processing chamber in the manufacture of circuit patterns thereon including the steps of:
(a) providing a source of processing fluid in liquid form,
(b) metering said processing fluid from said source in liquid form at the rate said processing fluid is used in said processing chamber and
(c) cyclically passing minute metered quantities of said processing fluid in liquid form into a relatively low pressure chamber that connects to said processing chamber,
(d) accompanied by heating said relatively low pressure chamber.

16. A method as in claim 15 wherein
(a) said cyclic passing is done by forcing said minute quantities of said processing fluid in liquid form into said relatively low pressure chamber that connects to said processing chamber.

17. A method as in claim 15 wherein the the flow of said processing fluid in liquid form for cyclic converting to gas is controlled by varying the rate of said passing.

18. A method as in claim 15 wherein the flow of said processing fluid in liquid form for cyclic converting to gas is controlled by varying the duty cycle of said cycles.

19. In apparatus for dry processing a semiconductor wafer that includes a vacuum processing chamber that contains the semiconductor wafer to be processed, an opening into said chamber for the flow of processing gas into said chamber, a source of processing fluid in liquid form, a fluid flow path between said source of processing fluid in liquid form and said opening for converting said liquid fluid into gas fluid, said converting means includes an impulse type fluid injector, means for energizing said impulse injector so that it draws liquid fluid from said source and injects minute quantities of said fluid into said evaporation chamber as a mixture of gas and vapor wherein said mixture is substantially all converted into gas that flows through said opening into said processing chamber, means for controlling said impulse injector to maintain a predetermined chamber pressure comprising,
(a) means for detecting pressure in said chamber, producing a signal representative thereof, herein called the chamber pressure signal,
(b) a source of control pulses for said impulse injector and
(c) means for modulating said control pulses in response to said pressure signal.

20. Apparatus as in claim 19 wherein said means for modulating modulates the rate of said control pulses.

21. Apparatus as in claim 20 wherein said rate of control pulses is modulated so that said rate is least when said chamber pressure is at said predetermined chamber pressure.

22. Apparatus as in claim 21 wherein,
(a) means are provided producing a signal representative of said predetermined chamber pressure,
(b) means are provided for comparing said detected chamber pressure and said predetermined chamber pressure producing a signal representative of the difference and
(c) said pulse rate is proportional to said difference signal.

23. Apparatus as in claim 22 wherein said rate of control pulses is proportional to said difference when said detected chamber pressure is less than said predetermined chamber pressure.

24. Apparatus as in claim 23 wherein injection by said injector stops when said detected chamber pressure is greater than said predetermined chamber pressure.

* * * * *